(12) United States Patent
Hori et al.

(10) Patent No.: US 6,225,701 B1
(45) Date of Patent: May 1, 2001

(54) SEMICONDUCTOR DEVICE PROVIDED WITH HEAT-SINK AND METHOD OF MANUFACTURING THE SAME

(75) Inventors: Tetsuji Hori; Cao Minh Thai, both of Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/518,092

(22) Filed: Mar. 3, 2000

(30) Foreign Application Priority Data

Mar. 5, 1999 (JP) ................................................ 11-058749

(51) Int. Cl.$^7$ ................................................ H01L 23/495
(52) U.S. Cl. ....................... 257/783; 257/706; 257/707; 257/677
(58) Field of Search .................................. 257/666, 677, 257/783, 706, 707; 438/123, 111, 628

(56) References Cited

U.S. PATENT DOCUMENTS

| 4,642,716 | * | 2/1987 | Wakabayashi et al. . |
| 5,367,196 | * | 11/1994 | Mahulkar et al. . |
| 5,442,234 | * | 8/1995 | Liang . |
| 5,644,164 | * | 7/1997 | Roh . |
| 5,691,567 | * | 11/1997 | Lo et al. . |
| 5,698,899 | * | 12/1997 | Hirakawa et al. . |
| 5,796,159 | * | 8/1998 | Kierse . |
| 5,814,878 | * | 9/1998 | Hiradawa et al. . |
| 5,929,514 | * | 7/1999 | Yalamanuchili . |
| 5,986,885 | * | 11/1999 | Wyland . |
| 6,153,924 | * | 11/2000 | Kinsman . |
| 6,153,926 | * | 11/2000 | Kawamoto . |

FOREIGN PATENT DOCUMENTS 7-10955   2/1995 (JP) .

* cited by examiner

*Primary Examiner*—Sheila V. Clark
(74) *Attorney, Agent, or Firm*—Oblon, Spivak, McClelland, Maier & Neustadt, P.C.

(57) ABSTRACT

Disclosed is a semiconductor device provided with a heat-sink. The semiconductor device comprises a laminated insulating film formed on the heat-sink, a lead-frame mounted on the laminated insulating film, a semiconductor chip mounted to the lead-frame, and a molding resin for molding the semiconductor chip. The laminated insulating film comprises a first insulating resin layer formed on the side of the heat-sink and a second insulating resin layer formed on the side of the lead-frame. The first insulating resin layer is made of an epoxy resin containing 80 wt % of a heat dissipating filler. Also, the second insulating resin layer is made of an epoxy resin containing 70 wt % of a heat dissipating filler.

14 Claims, 5 Drawing Sheets

SEMICONDUCTOR DEVICE PROVIDED WITH HEAT-SINK AND METHOD OF MANUFACTURING THE SAME

CROSS-REFERENCE TO RELATED APPLICATION

This application is based upon and claims the benefit of priority from the prior Japanese Patent Application No. 11-058749, filed Mar. 5, 1999, the entire contents of which are incorporated herein by reference.

BACKGROUND OF THE INVENTION

The present invention relates to a semiconductor device provided with a heat-sink and a method of manufacturing the same, particularly, to a semiconductor device in which a lead-frame is fixed to a heat-sink and a method of manufacturing the same.

A semiconductor device in which a lead-frame is fixed to a heat-sink is disclosed in, for example, Japanese Utility Model Disclosure (Kokai) No. 7-10955.

In this prior art, a polyimide-based resin containing a crystalline silica having a high heat conductivity is printed on a heat-sink, followed by applying a heat treatment to the printed resin to form a polyimide-based resin layer. Then, an epoxy resin having a good adhesivity is printed on the polyimide-based resin, followed by adhering a lead-frame assembly to the heat-sink with the epoxy resin interposed therebetween. Further, the semiconductor device is sealed with a resin molding body except the tip of the outer lead by using a known transfer mold.

In this prior art, excellent heat dissipating properties can be obtained because a polyimide-based resin layer containing 30 to 60 wt % of crystalline silica having a good heat conductivity is interposed between the lead-frame assembly and the heat-sink.

In this prior art, however, the polyimide-based resin layer formed on the heat-sink is adhered to the lead-frame with an adhesive epoxy resin layer interposed therebetween. As the result, a heat dissipating efficiency is decreased by amount that the epoxy resin layer provided between the lead-frame assembly and the heat-sink.

What should also be noted is that, since an epoxy resin layer is formed on the polyimide-based resin layer, a difficulty arises if the sealed semiconductor device is used for an unexpectedly long period of time or a power semiconductor device generating a large amount of heat is sealed with the resin. Specifically, cracks tend to occur in the bonding interface between the polyimide-based resin layer and the epoxy resin layer because of the difference in thermal expansion coefficient between the two.

BRIEF SUMMARY OF THE INVENTION

An object of the present invention, which has been achieved in view of the situation described above, is to provide a semiconductor device provided with a heat-sink, which is constructed to be excellent in durability and to withstand sufficiently the mounting of a power semiconductor element generating a large amount of heat, and a method of manufacturing the particular semiconductor device.

According to an aspect of the present invention, there is provided a semiconductor device, comprising: a heat-sink; a lead-frame; a laminated insulating film interposed between the heat-sink and the lead-frame, the laminated insulating film including a first layer positioned on the side of the heat-sink and made of an insulating matrix containing a heat dissipating filler and a second layer positioned on the side of the lead-frame and made of the insulating matrix containing the heat dissipating filler; an electronic part mounted to the lead-frame; and a molding body which molds the electronic part with the outer lead portion of the lead-frame and the heat dissipating surface of the heat-sink exposed to the outside.

In the semiconductor device of the construction described above, the heat dissipating efficiency can be improved because a heat dissipating filler is contained in all the layers constituting the laminated insulating film. Also, all the layers of the laminated insulating film are formed of the same kind of the matrix, with the result that cracks derived from a difference in thermal expansion coefficient is unlikely to be generated within the laminated insulating film. It follows that it is possible to obtain a semiconductor device provided with a heat-sink, which is constructed to be excellent in durability and to withstand sufficiently the mounting of a power semiconductor element generating a large amount of heat.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1A:
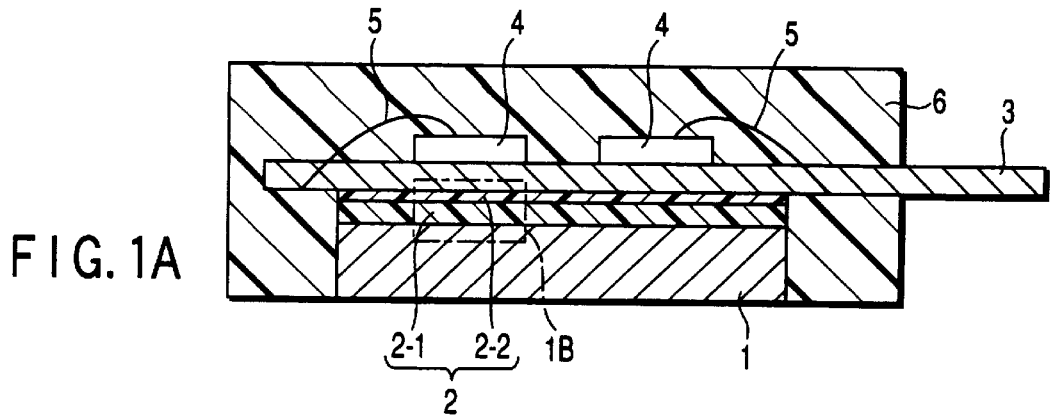
FIG. 1A is a cross sectional view showing a semiconductor device provided with a heat-sink according to a first embodiment of the present invention.

Some embodiments of the present invention will now be described with reference to the accompanying drawings. In the drawings, the common portions are denoted by common reference numerals.

FIRST EMBODIMENT

FIG. 1A is a cross sectional view showing a semiconductor device provided with a heat-sink according to a first embodiment of the present invention.

As shown in the drawing, a laminated insulating film 2 is formed on a heat-sink 1. The laminated insulating film 2 consists of a first insulating resin layer 2-1 formed of an epoxy resin as a matrix and a second insulating resin layer 2-2 formed on the first insulating resin layer 2-1 and formed of an epoxy resin as a matrix. A lead-frame 3 is mounted on the second insulating resin layer 2-2. A plurality of semiconductor chips 4 each having a power semiconductor element formed therein are mounted on the lead-frame 3. Each of the semiconductor chips 4, which constitutes an electronic part, is electrically connected to the lead-frame 3 via, for example, a bonding wire 5. Further, the semiconductor chips 4 and the bonding wires 5 are sealed with a molding resin 6, with the outer lead portion of the lead-frame 3 and the heat dissipating surface of the heat-sink 1 exposed to the outside.

Figure 1B:
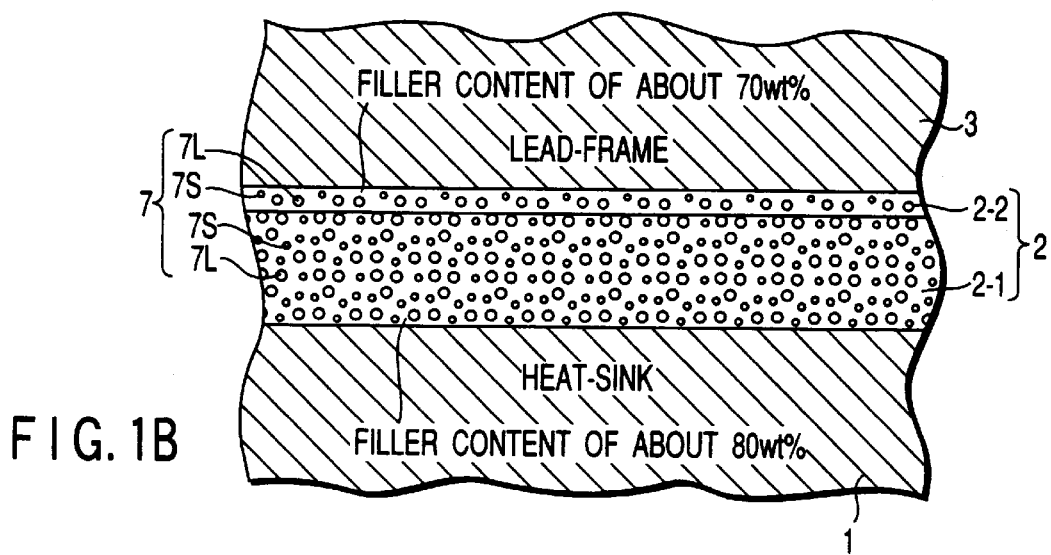
FIG. 1B shows in a magnified fashion a portion in FIG. 1A denoted by a dot-and-dash line 1B.

FIG. 1B shows in a magnified fashion a portion of FIG. 1A denoted by a dot-and-dash line 1B. As shown in FIG. 1B, a plurality of kinds of spherical alumina particles differing from each other in the average particle diameter are contained in each of the first resin layer 2-1 and the second resin layer 2-2. These alumina particles are used as a heat dissipating filler 7. In the embodiment shown in the drawing, two kinds of spherical alumina particles consisting of large particles 7L and small particles 7S are used as the heat dissipating filler 7. The large spherical alumina particles have an average particle diameter of about 20 μm. Also, the small spherical alumina particles have an average particle diameter of about 0.5 μm. It is desirable for the small alumina particles 7S to be mixed in an amount of about 0.1 to 30%, preferably about 0.3 to 10%, based on the amount of the large alumina particles 7L. The first resin layer 2-1 contains at least 70 wt %, preferably about 80 wt %, of the large and small alumina particles 7L and 7S mixed in a mixing ration noted above in view of the heat conductivity of the first resin layer 2-1. The second resin layer 2-2 also contains the spherical alumina particles 7L and 7S mixed in a mixing ratio noted above in an amount substantially equal to that in the first resin layer 2-1.

In the first embodiment, the spherical alumina particles 7L and 7S are contained in the second resin layer 2-2 in an amount somewhat smaller than that in the first resin layer 2-1 in view of the adhesivity of the second resin layer 2-2 to the lead-frame 3. To be more specific, the spherical alumina particles 7L and 7S are contained in the second resin layer 2-2 in an amount of, preferably, about 70 wt %.

The thickness of the laminated insulating film 2, i.e., the sum of the thickness of the first resin layer 2-1 and the thickness of the second resin layer 2-2, is adjusted in view of the insulating capability required for the product semiconductor device, the kind of the matrix used, etc. The semiconductor device of the first embodiment is advantageous in that the thickness of the laminated insulating film 2 can be decreased because the adhesivity between the lead-frame 3 and the second resin layer 2-2 is improved. The heat dissipating properties are improved with decrease in the thickness of the laminated insulating film 2. Where an epoxy resin is used as the matrix of the laminated insulating film 2 and alumina particles are used as the heat dissipating filler 7 to allow an insulating capability of about 2500V to about 6000V, it suffices for the thickness of the laminated insulating film 2 to be about 180 μm to 200 μm. In the semiconductor device of the first embodiment, the thickness of the first resin layer 2-1 was set at 150 gm and that of the second resin layer 2-2 at 30 μm, totaling 180 μm in the thickness of the laminated insulating film 2.

In the semiconductor device provided with a heat-sink according to the first embodiment of the present invention, the heat dissipating filler 7 is contained in any of the layers constituting the laminated insulating film 2, leading to an improved heat dissipating efficiency, compared with the semiconductor device in which the heat dissipating filler 7 is not contained in all the layers of the insulating film. Also, all the layers of the laminated insulating layer 2 are formed of the same kind of the matrix, i.e., an epoxy resin in the embodiment described above. As a result, cracks derived from a difference in thermal expansion coefficient are not brought about within the laminated insulating film 2. It follows that it is possible to obtain a semiconductor device provided with a heat-sink, which is constructed to be excellent in durability and to withstand sufficiently the mounting of a power semiconductor element generating a large amount of heat.

The semiconductor device of the first embodiment produces additional merits as pointed out below.

Specifically, as already described, the amount of the heat dissipating filler 7 contained in the second resin layer 2-2 is smaller than that in the first resin layer 2-1. As a result, the bonding strength between the second resin layer 2-2 and the lead-frame 3 can be increased while maintaining the particular function and effect of the laminated insulating film 2 described above. To be more specific, since the heat dissipating filler 7 is contained in a small amount in the resin layer 2-2, an irregularity is unlikely to be formed on the surface of the resin layer 2-2, leading to the improved bonding strength between the resin layer 2-2 and the lead-frame 3. It should be noted in particular that the irregularity formed on the surface of the resin layer 2-2 is likely to form the voids or bubbles in the bonding surface with the lead-frame 3. Naturally, the presence of the voids lowers the bonding strength between the resin layer 2-2 and the lead-frame 3. Particularly, the decrease in the bonding strength caused by the presence of the voids promotes reduction in the insulating capability, in the life of the semiconductor device, and in the heat dissipating capability.

Also, the first resin layer 2-1 is formed thicker than the second resin layer 2-2 in the first embodiment of the present invention. This construction is effective for improving the heat dissipating capability. To be more specific, the absolute amount of the heat dissipating filler 7 contained in the entire heat insulating film 2 is increased where the resin layer 2-1 having a higher content (percentage) of the heat dissipating filler 7 is formed thicker, leading to an improved heat dissipating capability. The thickness of the second resin layer 2-2 is practically not larger than 50% of the thickness of the first resin layer 2-1.

It should also be noted that spherical particles are used as the heat dissipating filler 7 in the present invention, leading to a further improved bonding strength between the second resin layer 2-2 and the lead-frame 3. To be more specific, in the case of using spherical particles as the heat dissipating filler 7, an irregularity is unlikely to be formed on the surface of each of the first and second resin layers 2-1 and 2-2, compared with the case of using crushed particles, leading to the improved bonding strength noted above. As already described, the irregularity tends to form the voids.

Also, the spherical filler consists of a plurality of spherical particles differing from each other in an average diameter. The spherical filler of the particular construction makes it possible to improve the heat conductivity of the laminated insulating film 2 because it is possible to improve the loading properties of the spherical filler.

What should also be noted is that alumina particles are used as the heat dissipating filler 7, leading to an improved heat dissipating properties, because the heat conductivity of alumina is higher than that of the general crystalline silica.

A preferred method of manufacturing a semiconductor device provided with a heat-sink according to the first embodiment of the present invention will now be described.

A method of manufacturing a heat-sink provided with a laminated insulating film will now be described first.

Figure 2A:
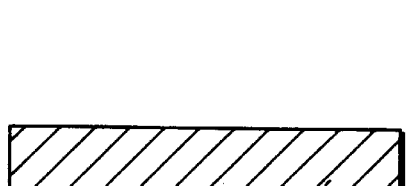
FIGS. 2A, 2B and 2C are cross sectional views showing the main steps for preparing a heat-sink provided with a laminated insulating film.
Figure 2B:
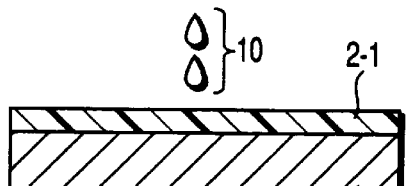
Figure 2C:
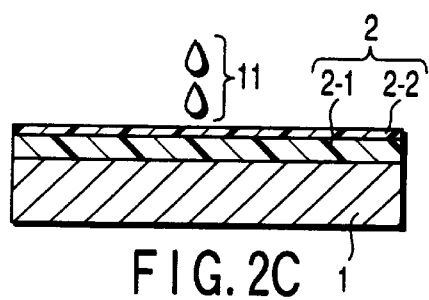

Specifically, FIGS. 2A to 2C are cross sectional views collectively showing a method of manufacturing a heat-sink provided with a laminated insulating film. In the first step, a heat-sink 1 made of, for example, aluminum is prepared, as shown in FIG. 2A. In the next step, prepared are a liquid epoxy resin 10 for a first layer containing about 80 wt % of a heat dissipating filler 7 consisting of large spherical alumina particles 7L and small spherical alumina particles 7S and a liquid epoxy resin 11 for a second layer containing about 70 wt % of a heat dissipating filler 7 consisting of large spherical alumina particles 7L and small spherical alumina particles 7S.

Then, the heat-sink 1 is coated with the liquid epoxy resin 10 for the first layer in a thickness of about 150 μm, as shown in FIG. 2B. A print coating, potting, etc. can be employed for the coating. Then, the coating is dried at 80° C. for 10 minutes, at 120° C. for 10 minutes and, then, at 150° C. for 10 minutes so as to form a first resin layer 2-1 of a semi-hardened state.

In the next step, the surface of the first resin layer 2-1 is coated with the liquid epoxy resin 11 for the second layer in a thickness of about 50 μm, as shown in FIG. 2C. A print coating, a potting, etc. can be employed for the coating as in the formation of the first resin layer 2-1. Then, the coating is dried at 80° C. for 10 minutes and, then, at 120° C. for 10 minutes so as to form a second resin layer 2-2 of a semi-hardened state. In this fashion, the heat-sink 1 provided with the laminated insulating film 2 of a semi-hardened state is manufactured. Incidentally, the first resin layer 2-1 is formed thicker than the second resin layer 2-2.

Figure 3A:
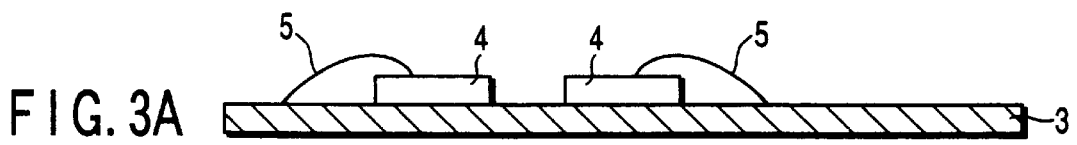
FIGS. 3A, 3B and 3C are cross sectional views showing the main steps for manufacturing a semiconductor device provided with a heat-sink according to the first embodiment of the present invention.
Figure 3B:
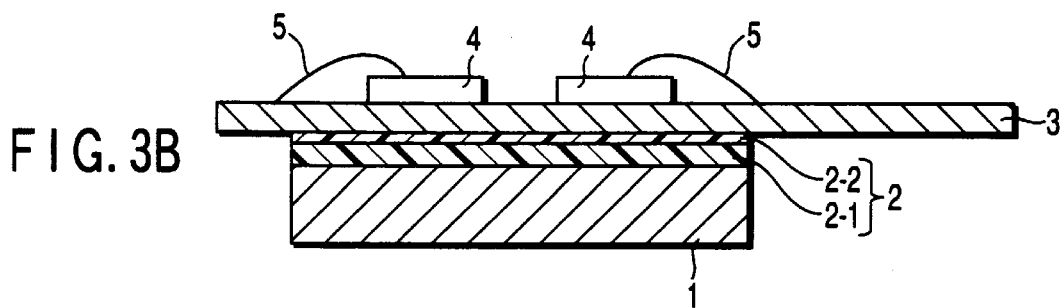
Figure 3C:
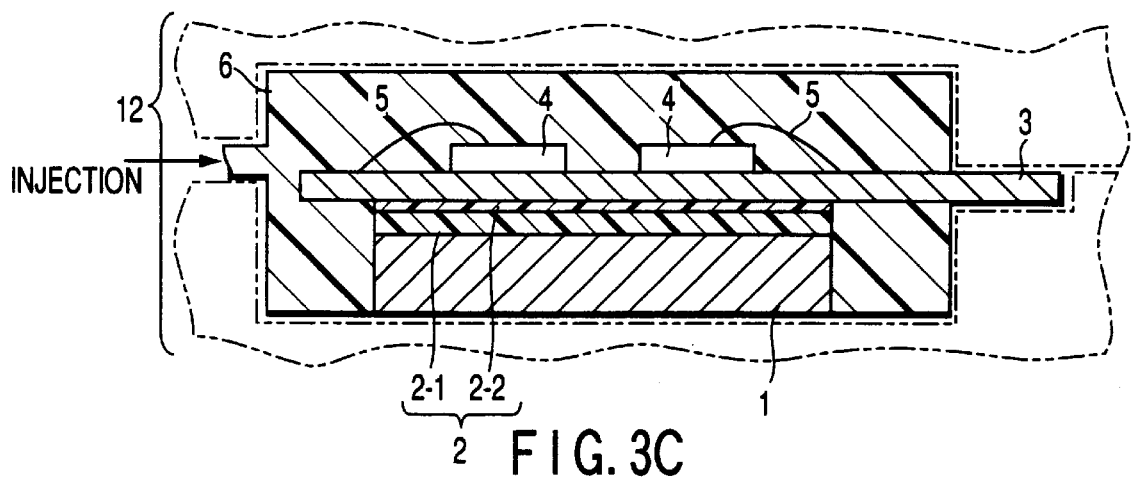

FIGS. 3A to 3C are cross sectional views collectively showing how to manufacture a semiconductor device provided with a heat-sink according to the first embodiment of the present invention.

In the first step, semiconductor chips 4 are bonded to a lead-frame 3 by a die bonding, as shown in FIG. 3A. Then, the semiconductor chips 4 are electrically connected to the lead-frame via bonding wires 5.

In the next step, the lead-frame 3 is brought into contact with or attached to the laminated insulating film 2 of a semi-hardened state that is formed on the heat-sink 1 shown in FIG. 2C, as shown in FIG. 3B.

Then, the resultant structure is molded with a molding resin 6 by a transfer molding under the condition that the outer lead portion of the lead-frame 3 and the heat dissipating surface of the heat-sink 1 are exposed to the outside, as shown in FIG. 3C. During the transfer molding process, the molding resin 6 such as an epoxy resin is pushed into the cavity of a mold 12. The molding resin 6 pushed into the mold cavity presses the lead-frame 3 against the laminated insulating film 2. Further, the mold 12 is heated to, for example, 170° C. during the transfer molding process. As a result, the laminated insulating film 2 of a semi-hardened state is once melted and, then, thermally cured. Under these process conditions, the lead-frame 3 and the laminated insulating film 2 are further strongly bonded to each other. Likewise, the laminated insulating film 2 and the heat-sink 1 are further strongly bonded to each other.

Then, the product is taken out of the mold 12 and deburred so as to obtain a power module product as shown in FIG. 1A.

In the manufacturing method described above, the heat-sink 1, the laminated insulating film 2 and the lead-frame 3 can be sealed by a single transfer molding operation. Therefore, the number of manufacturing steps is not increased in the manufacture of the semiconductor device of the present invention, making it possible to suppress the increase in the manufacturing cost.

The manufacturing method of the present invention produces additional merits as described below.

Specifically, under the state shown in FIG. 2C, the first resin layer 2-1 is made harder than the second resin layer 2-2. As a result, even if the lead-frame 3 is pressed against the laminated insulating film 2 by the molding resin 6 injected under pressure, the lead-frame 3 is prevented from being brought into contact with the heat-sink I in the transfer molding step shown in FIG. 3C.

What should also be noted is that, since the second resin layer 2-2 is softer than the first resin layer 2-1, the laminated insulating film 2 exhibits an adhesivity. As a result, the heat-sink 1 is provisionally kept attached to the lead-frame 3 and, under this condition, the semiconductor device provided with the heat-sink 1 can be transferred from the assembling apparatus into the mold 12.

The manufacturing method described above can be modified as follows.

Specifically, the laminated insulating film 2 can be cured in the step shown in FIG. 3C until the hardness of each of the first resin layer 2-1 and the second resin layer 2-2 is saturated. Alternatively, the degree of curing of the second resin layer 2-2 may be made lower than that of the first resin layer 2-1. If the degree of curing of the second resin layer 2-2 is made lower than that of the first resin layer 2-1, the second resin layer 2-2 is made elastic. The resin layer 2-2 having an elasticity serves to absorb the stress generated by the thermal expansion/shrinkage of the lead-frame 3 and, thus, functions as a buffer material. It follows that it is possible to suppress the crack occurrence caused by the thermal expansion.

SECOND EMBODIMENT

In the first embodiment, a spherical filler, particularly spherical alumina particles, is used as the heat dissipating filler 7 as a particularly preferred embodiment of the present invention. Alternatively, it is of course possible to use a crushed (or angular) filler as the heat dissipating filler 7.

The second embodiment is directed to the use of an angular filler. The angular filler used in the present invention includes, for example, angular alumina particles, angular silicon nitride particles, etc., which are superior to the crystalline silica in the heat conductivity. In the second embodiment described below, angular silicon nitride particles are used as the heat dissipating filler.

Figure 4:
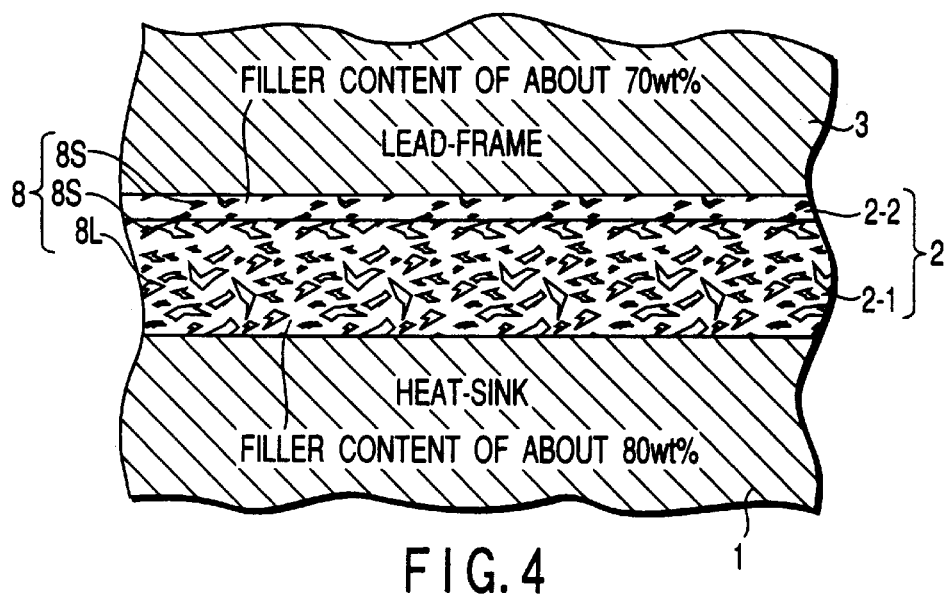
FIG. 4 is a cross sectional view showing in a magnified fashion a main portion of a semiconductor device provided with a heat-sink according to a second embodiment of the present invention.

FIG. 4 is a cross sectional view showing in a magnified fashion a main part of a semiconductor device provided with a heat-sink according to the second embodiment of the present invention. The cross section shown in FIG. 4 corresponds to that part which is surrounded by a dot-and-dash line 1B in FIG. 1A.

As shown in FIG. 4, the laminated insulating film 2 is formed on the heat-sink 1. In the second embodiment, the laminated insulating film 2 consists of a first insulating resin layer 2-1 using an epoxy resin as a matrix and a second insulating resin layer 2-2 formed on the first insulating resin layer 2-1 and containing an epoxy resin as a matrix. Further, the lead-frame 3 is mounted on the resin layer 2-2.

Each of the first resin layer 2-1 and the second resin layer 2-2 contains angular silicon nitride particles as a heat dissipating filler 8. The heat dissipating filler 8 contained in the resin layer 2-1 consists of a plurality of kinds of angular silicon nitride particles differing from each other in the average particle diameter. In the second embodiment, the heat dissipating filler 8 consists of two kinds of angular silicon nitride particles. In FIG. 4, the angular silicon nitride particles having a large particle diameter are denoted by a reference numeral 8L. Likewise, the angular silicon nitride particles having a small particle diameter are denoted by a reference numeral 8S. The angular silicon nitride particles 8L have an average particle diameter of about 20 $\mu$m. On the other hand, the angular silicon nitride particles 8S have an average particle diameter of about 0.5 $\mu$m. In the second embodiment, the angular silicon nitride particles 8L are contained in an amount of about 0.1 to 40% of the angular silicon nitride particles 8S. The first resin layer 2-1 contains at least about 70 wt %, preferably about 80 wt %, of the angular silicon nitride particles 8L and 8S mixed at the mixing ratio noted above.

On the other hand, the second resin layer 2-2 contains only the angular silicon nitride particles 8S having a small particle diameter to permit the average particle diameter of the heat dissipating filler 8 contained in the second resin layer 2-2 to be smaller than that in the first resin layer 2-1. The second resin layer 2-2 contains the angular silicon nitride particles 8S having a small particle diameter in an amount substantially equal to that contained in the first resin layer 2-1. In other words, the second resin layer 2-2 contains at least about 70 wt %, preferably about 80%, of the angular silicon nitride particles BS.

In the second embodiment, the second resin layer 2-2 contains the angular silicon nitride particles 8S having a small particle diameter in an amount smaller than that in the first resin layer 2-1. Preferably, about 70 wt % of the angular silicon nitride particles BS are contained in the second resin layer 2-2 in view of the bonding strength between the second resin layer 2-2 and the lead-frame 3.

Also, the first resin layer 2-1 is formed thicker than the second resin layer 2-2 in view of the situation described previously in conjunction with the first embodiment.

In the semiconductor device provided with a heat-sink according to the second embodiment of the present invention, all the layers constituting the laminated insulating film 2 contain the heat dissipating filler 8 as in the first embodiment. Also, all the layers constituting the laminated insulating film 2 are formed of the same matrix, e.g., an epoxy resin or a polyimide resin. Further, the mixing ratio of the heat dissipating filler 8 in the second resin layer 2-2 is lower than that in the first resin layer 2-1. As a result, the prominent effects obtained in the first embodiment can also be obtained in the second embodiment.

The second embodiment produces additional merits as pointed out below.

First of all, the average particle diameter of the angular filler contained in the second resin layer 2-2 is smaller than the average particle diameter of the angular filler contained in the first resin layer 2-1. Because of this construction, an irregularity is unlikely to be formed on the surface of, particularly, the resin layer 2-2. As a result, the voids or bubbles are unlikely to be formed on the bonding surface between the resin layer 2-2 and the lead-frame 3 so as to improve the bonding strength between the resin layer 2-2 and the lead-frame 3.

Also, the angular filler is generally cheaper than the spherical filler, leading to a low manufacturing cost, compared with the first embodiment.

The manufacturing method of the second embodiment is basically equal to the method described previously with reference to FIGS. 2A to 2C and 3A to 3C, except that, in the second embodiment, prepared are a liquid epoxy resin for the first resin layer containing about 80 wt % of the heat dissipating filler 8 consisting of the angular silicon nitride particles 8L and the angular silicon nitride particles 8S, and another liquid epoxy resin for the second resin layer containing about 70 wt % of the heat dissipating filler 8 consisting of the angular silicon nitride particles 8S having a small particle diameter.

THIRD EMBODIMENT

In the present invention, it is naturally possible to use a spherical filler and an angular filler in combination.

In the third embodiment, both spherical filler and angular filler are used as the heat dissipating filler. To be more, spherical alumina particles and angular alumina particles are used simultaneously as the heat dissipating filler in the third embodiment.

Figure 5:
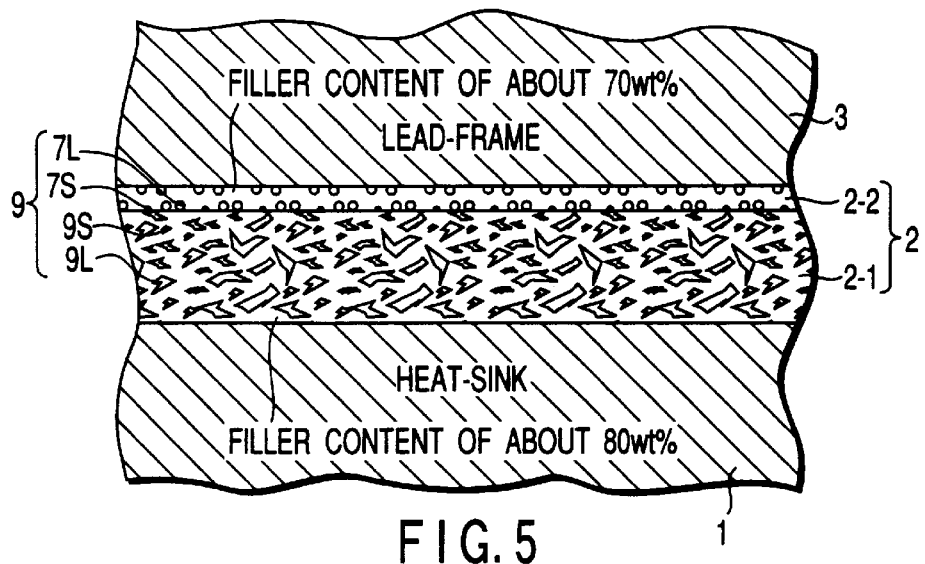
FIG. 5 is a cross sectional view showing in a magnified fashion a main portion of a semiconductor device provided with a heat-sink according to a third embodiment of the present invention.

FIG. 5 is a cross sectional view showing in a magnified fashion a main part of a semiconductor device provided with a heat-sink according to the third embodiment of the present invention. Incidentally, the cross section shown in FIG. 5 corresponds to that region of FIG. 1A which is surrounded by the dot-and-dash line 1B in FIG. 1A.

As shown in FIG. 5, the laminated insulating film 2 is formed on the heat-sink 1. In the third embodiment, the laminated insulating film 2 consists of the first insulating resin layer 2-1 containing an epoxy resin as a matrix and the second insulating resin layer 2-2 formed on the first resin layer 2-1 and containing an epoxy resin as a matrix. Further, the lead-frame 3 is mounted on the second resin layer 2-2.

The first resin layer 2-1 contains the heat dissipating filler 9 consisting of a plurality of kinds of angular alumina particles differing from each other in the average particle diameter. To be more specific, the heat dissipating filler 9 consists of angular alumina particles 9L having a large average particle diameter and angular alumina particles 9S having a small average particle diameter. The angular alumina particles 9L have an average particle diameter of, for example, about 20 $\mu$m. On the other hand, the angular alumina particles 9S have an average particle diameter of, for example, about 0.5 $\mu$m. In the third embodiment, the angular alumina particles 9L are contained in an amount of about 0.1 to 40% of the angular alumina particles 9S having a small average particle diameter. The angular alumina particles 9L and 9S mixed in a mixing ratio noted above are contained in the first resin layer 2-1 in an amount of at least about 70 wt %, preferably about 80 wt %, in view of the heat conductivity of the first resin layer 2-1.

The second resin layer 2-2 contains the heat dissipating filler 9 consisting of a plurality of kinds of spherical alumina particles differing from each other in the average particle diameter. To be more specific, the heat dissipating filler 9 comprises spherical alumina particles 7L having a large average particle diameter and spherical alumina particles 7S having a small average particle diameter. The spherical alumina particles 7L have an average particle diameter of, for example, about 20 $\mu$m. On the other hand, the spherical alumina particles 7S have an average particle diameter of, for example, about 0.5 $\mu$m. In the third embodiment, the spherical alumina particles 7S are contained in an amount of about 0.1 to 30% of the spherical alumina particles 7L having a large average particle diameter. The spherical alumina particles 7L and 7S mixed in a mixing ratio noted above are contained in the first resin layer 2-1 in an amount substantially equal to that in the first resin layer 2-1.

In the third embodiment, the spherical alumina particles 7L and 7S are contained in the second resin layer 2-2 in an amount smaller than that in the first resin layer 2-1 in view of the bonding strength between the second resin layer 2-2 and the lead-frame 3. To be more specific, the spherical alumina particles 7L, 7S are contained in the second resin layer 2-2 in an amount of about 70 wt %.

Also, the first resin layer 2-1 is formed thicker than the second resin layer 2-2 in view of the situation described previously in conjunction with the first embodiment.

In the semiconductor device provided with a heat-sink according to the third embodiment of the present invention, all the layers constituting the laminated insulating film 2 contain the heat dissipating filler 9 as in the first embodiment. Also, all the layers constituting the laminated insulating film 2 are formed of the same matrix, e.g., an epoxy resin or a polyimide resin. Further, the mixing ratio of the heat dissipating filler 9 in the second resin layer 2-2 is lower than that in the first resin layer 2-1. As a result, the prominent effects obtained in the first and second embodiments can also be obtained in the third embodiment.

What should also be noted is that, in the third embodiment, the spherical alumina particles 7L and 7S are contained in the second resin layer 2-2, and angular alumina particles 9L, 9S are contained in the first resin layer 2-1. The particular construction permits lowering the manufacturing cost of the semiconductor device, compared with the case where the spherical alumina particles 7L, 7S are contained in all the layers constituting the laminated insulating film 2.

The manufacturing method of the third embodiment is basically equal to the method described previously with reference to FIGS. 2A to 2C and 3A to 3C, except that, in the second embodiment, prepared are a liquid epoxy resin for the first resin layer containing about 80 wt % of the heat dissipating filler 9 consisting of the angular alumina particles 9L and the angular alumina particles 9S, and another liquid epoxy resin for the second resin layer containing about 70 wt % of the heat dissipating filler 9 consisting of the spherical alumina particles 8L and spherical alumina particles 8S having a small particle diameter.

FOURTH EMBODIMENT

Figure 6:
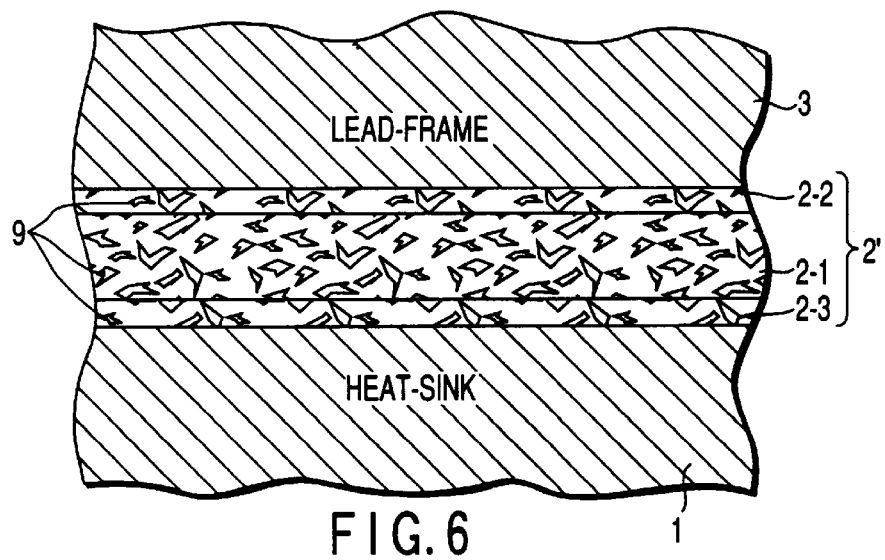
FIG. 6 is a cross sectional view showing in a magnified fashion a main portion of a semiconductor device provided with a heat-sink according to a fourth embodiment of the present invention.

FIG. 6 is a cross sectional view showing in a magnified fashion a main part of a semiconductor device provided with a heat-sink according to the fourth embodiment of the present invention. Incidentally, the cross section shown in FIG. 6 corresponds to that region of FIG. 1A which is surrounded by the dot-and-dash line 1B in FIG. 1A.

As shown in FIG. 6, the laminated insulating film 2' is formed on the heat-sink 1. In the fourth embodiment, the laminated insulating film 2' is of a three-layer structure consisting of the first insulating resin layer 2-1, the second insulating resin layer 2-2 formed on one surface of the first resin layer 2-1, and a third resin layer 2-3 formed on the other surface of the first insulating layer 2-1. Further, the resin layer 2-3 is connected to the heat-sink 1, and the lead-frame 3 is mounted on the second resin layer 2-2.

In the fourth embodiment, each of the first to third resin layers 2-1 to 2-3 contains an epoxy resin as a matrix and a filler 9 consisting of angular alumina particles. Each of the resin layers 2-2 and 2-3 is thinner than the resin layer 2-1. What should be noted is that the laminated insulating film 2' may include three or more resin layers.

An adhesive tape effective for use in the fourth embodiment will now be described. Specifically, FIG. 7 is a cross sectional view showing the adhesive tape used in the fourth embodiment.

Figure 7:
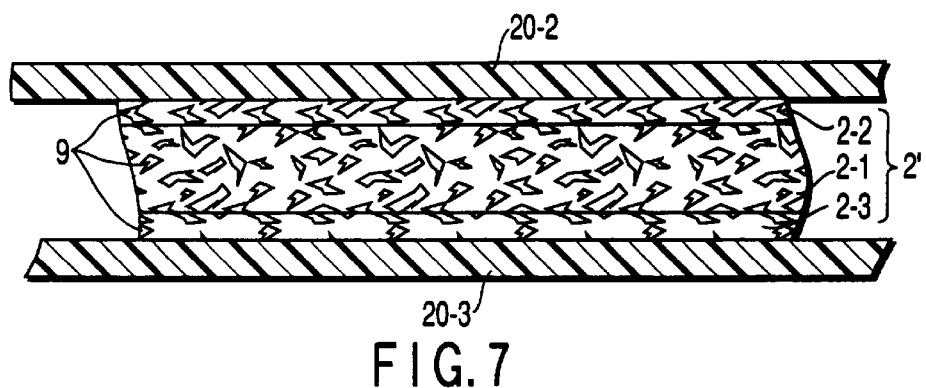
FIG. 7 is a cross sectional view showing an adhesive tape.

As shown in FIG. 7, the adhesive tape is formed of the laminated insulating film 2', which is of a three-layer structure consisting of the first insulating resin layer 2-1, the second insulating resin layer 2-2 formed on one surface of the first insulating resin layer 2-1, and the third insulating resin layer 2-3 formed on the other surface of the first insulating resin layer 2-1. These resin layers 2-1 to 2-3 are equal to the resin layers 2-1 to 2-3 shown in FIG. 6, except that the resin layers 2-1 to 2-3 shown in FIG. 7 are in a semi-hardened state and that the degree of hardening of each of the resin layers 2-2 and 2-3 is lower than that of the resin layer 2-1. Further, PET (polyethylene terephthalate) films 20-2 and 20-3 are formed on the resin layers 2-2 and 2-3, respectively.

The lead-frame 3 is bonded to the heat-sink 1 by using the adhesive tape of the construction described above as follows.

Figure 8A:
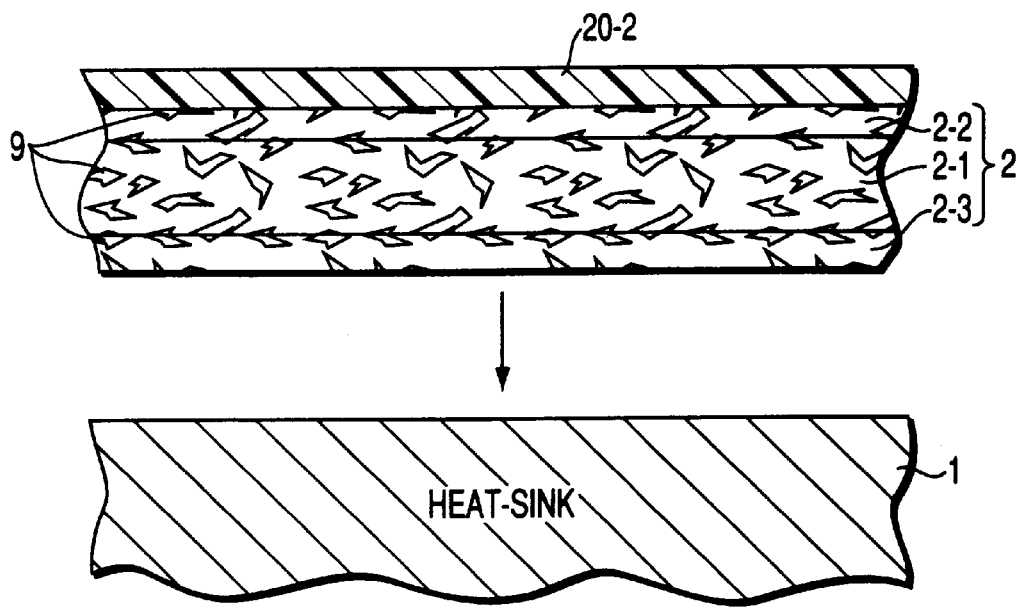
FIGS. 8A and 8B are cross sectional views each showing an adhesion step.
Figure 8B:
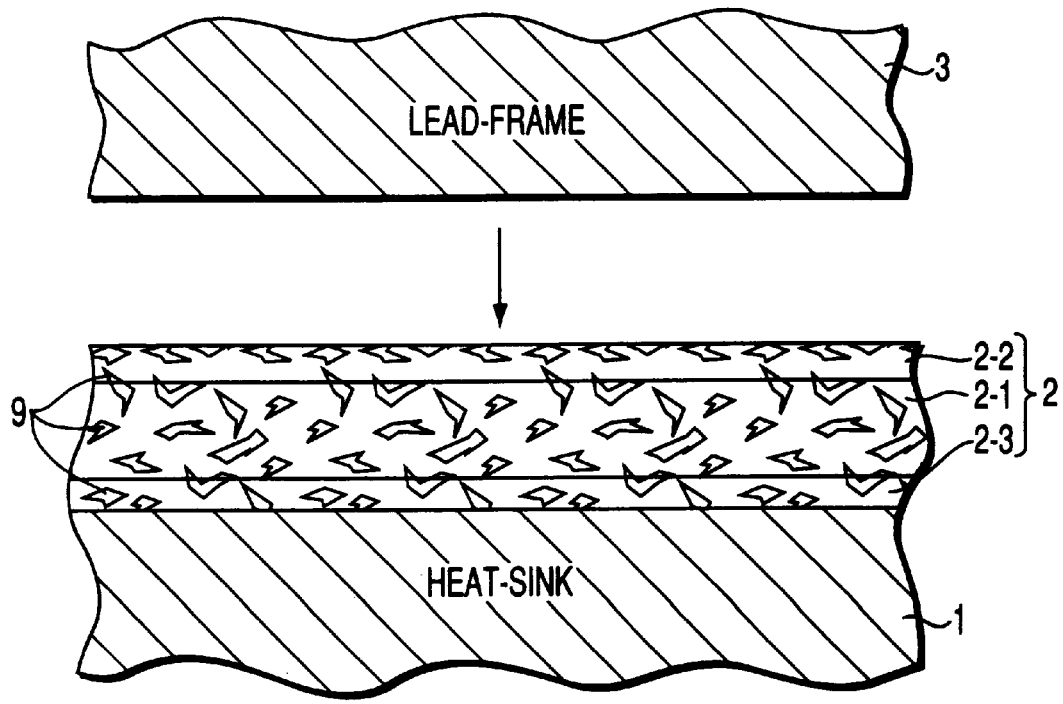

FIGS. 8A and 8B are cross sectional views collectively showing the bonding process. In the first step, the PET film 20-3 is peeled off to expose the resin layer 2-3 as shown in FIG. 8A, followed by bonding the heat-sink 1 to the resin layer 2-3. Incidentally, the adhesive tape is cut in advance to conform with, for example, the shape of the heat-sink 1.

In the next step, the PET film 20-2 is peeled off to expose the resin layer 2-2 as shown in FIG. 8B, followed by bonding the lead-frame 3 to the resin layer 2-2. Further, the process described previously in conjunction with, for example, FIG. 3C is performed so as to obtain the apparatus as shown in FIG. 6.

Use of the particular adhesive tape is advantageous in that the laminated insulating film can be formed on the heat-sink 1 even if the heat-sink 1 has a complex shape. When it comes to, for example, the heat-sink 1 having, for example, mounting holes, it is difficult to form the laminated insulating film directly on the heat-sink 1. In the case of using the adhesive tape described above, however, it is possible to form holes in those portions of the adhesive tape which conform with the mounting holes of the heat-sink 1. It follows that the laminated insulating film can be formed easily even on the heat-sink 1 having mounting holes.

Figures 9A, 9B, 9C:
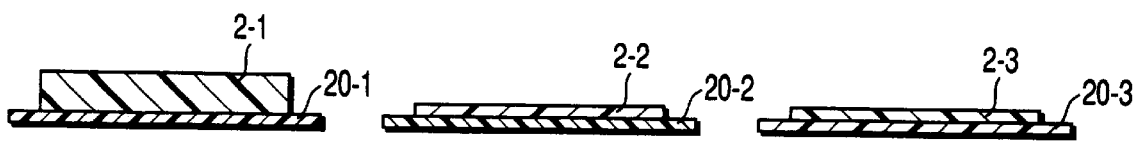
FIGS. 9A, 9B, 9C, 9D, and 9E are cross sectional views collectively showing a process of manufacturing an adhesive tape.

The adhesive tape shown in FIG. 7 is manufactured as follows. Specifically, FIGS. 9A to 9E are cross sectional views collectively showing the manufacturing process of the adhesive tape. In the first step, the PET film 20-1 is coated with a liquid epoxy resin containing the filler 9 in a thickness of about 150 µm, as shown in FIG. 9A, followed by drying the coating at 80° C. for 10 minutes, at 120° C. for 10 minutes and, then, at 150° C. for 10 minutes so as to form the first resin layer 2-1 of a semi-hardened state.

In the next step, the PET film 20-2 is coated with a liquid epoxy resin containing the filler 9 in a thickness of about 25 µm, as shown in FIG. 9B, followed by drying the coating at 80° C. for 10 minutes and, then, at 120° C. for 10 minutes so as to form the second resin layer 2-2 of a semi-hardened state. Further, the PET film 20-3 is coated with a liquid epoxy resin containing the filler 9 in a thickness of about 25 µm, as shown in FIG. 9C, followed by drying the coating at 80° C. for 10 minutes and, then, at 120° C. for 10 minutes so as to form the third resin layer 2-3 of a semi-hardened state.

Figure 9D:
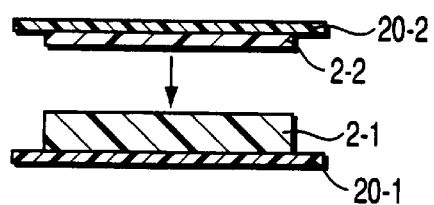
Figure 9E:
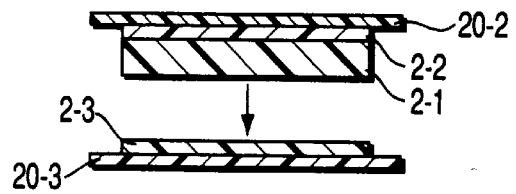

In the next step, the resin layers 2-1 and 2-2 are positioned to face each other, as shown in FIG. 9D, followed by bonding the resin layer 2-1 to the resin layer 2-2. Then, the PET film 20-1 is peeled off to expose the resin layer 2-1, as shown in FIG. 9E, followed by positioning the resin layers 2-1 and 2-3 to face each other. Then, the resin layer 2-1 is bonded to the resin layer 2-3, thereby obtaining the adhesive tape shown in FIG. 7.

As described above, the present invention provides a semiconductor device provided with a heat-sink, which is excellent in durability and constructed to be capable of fully withstanding the mounting of a power semi-conductor element generating heat of a high temperature, and a method of manufacturing the particular semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a heat-sink;
    a lead-frame;
    a laminated insulating film interposed between the heat-sink and the lead-frame, the laminated insulating film including a first layer positioned on the side of the heat-sink and made of an insulating matrix containing a heat dissipating filler and a second layer positioned on the side of the lead-frame and made of the insulating matrix containing the heat dissipating filler;
    an electronic part mounted to the lead-frame; and
    a molding body which molds the electronic part with the outer lead portion of the lead-frame and the heat dissipating surface of the heat-sink exposed to the outside.

2. The semiconductor device according to claim 1, wherein the insulating matrix contained in the first layer is hardened in a first degree, and the insulating matrix contained in the second layer is hardened in a second degree lower than the first degree.

3. The semiconductor device according to claim 1, wherein the first layer contains the heat dissipating filler in a first ratio and the second layer contains the heat dissipating filler in a second ratio lower than the first ratio.

4. The semiconductor device according to claim 1, wherein the first layer is thicker than the second layer.

5. The semiconductor device according to claim 1, wherein the heat dissipating filler comprises spherical particles.

6. The semiconductor device according to claim 5, wherein the spherical particles are alumina particles.

7. The semiconductor device according to claim 1, wherein the heat dissipating filler comprises angular particles.

8. The semiconductor device according to claim 7, wherein the average particle diameter of the angular particles contained in the first layer is larger than an average particle diameter of the heat dissipating filler contained in the second layer.

9. The semiconductor device according to claim 7, wherein the angular particles are selected from the group consisting of alumina particles and silicon nitride particles.

10. The semiconductor device according to claim 1, wherein the heat dissipating filler contained in the first layer comprises angular particles, and the heat dissipating filler contained in the second layer comprises of spherical particles.

11. The semiconductor device according to claim 10, wherein each of the angular particles and the spherical particles are alumina particles.

12. A method of manufacturing a semiconductor device comprising:
    forming a first layer made of an insulating matrix containing a heat dissipating filler on a heat-sink;
    forming a second layer made of the insulating matrix containing the heat dissipating filler on the first layer;
    connecting a lead-frame having an electronic part mounted thereon to the second layer; and
    molding the electronic part with the outer lead portion of the lead-frame and the heat dissipating surface of the heat-sink exposed to the outside.

13. The method of manufacturing a semiconductor device according to claim 12, wherein the insulating matrix contained in the first layer is hardened in a first degree, and the insulating matrix contained in the second layer is hardened in a second degree lower than the first degree.

14. The method of manufacturing a semiconductor device according to claim 12, wherein the first layer contains the heat dissipating filler in a first ratio and the second layer contains the heat dissipating filler in a second ratio lower than the first ratio.

* * * * *